United States Patent
Yang et al.

(10) Patent No.: US 6,358,328 B1
(45) Date of Patent: Mar. 19, 2002

(54) METHOD FOR DRY CLEANING A WAFER CONTAINER

(75) Inventors: Huai-Tei Yang; Suan-Jun Kuan; Ching-Ling Lee; Kuo-Hung Liao, all of Hsin-Chu (TW)

(73) Assignee: Taiwan SEmiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/488,427

(22) Filed: Jan. 20, 2000

(51) Int. Cl.⁷ ............................. A47L 5/14; B08B 5/02; B08B 5/04
(52) U.S. Cl. ....................... 134/21; 134/25.1; 134/25.4; 134/30; 15/300.1; 15/302; 15/303
(58) Field of Search ................. 134/21, 25.1, 25.4, 134/30; 15/300.1, 302, 303

(56) References Cited

U.S. PATENT DOCUMENTS 5,551,165 A * 9/1996 Turner et al. .................. 34/404
5,896,674 A * 4/1999 Kim et al. ...................... 34/480
6,096,100 A * 8/2000 Guldi et al. .................... 134/21

\* cited by examiner

Primary Examiner—Zeinab El-Arini
(74) Attorney, Agent, or Firm—Tung & Associates

(57) ABSTRACT

A method for dry cleaning a wafer container such as a SMIF pod that is equipped with a bottom mounting plate covered with contaminating particles. In the method, the wafer containers are mounted in openings of the enclosure such that the bottom mounting plates with the contaminating particles are exposed to an air-tight cavity of the enclosure. A purge gas flow is then directed to the bottom of the plate to dislodge the contaminating particles which are then picked up by a vacuum conduit positioned juxtaposed to the purge gas conduit and connected to a factory vacuum source such that contaminating particles dislodged are immediately removed. The present invention novel method can be carried out without using wet bench cleaning while achieving desirable and efficient cleaning results.

10 Claims, 2 Drawing Sheets

METHOD FOR DRY CLEANING A WAFER CONTAINER

FIELD OF THE INVENTION

The present invention generally relates to a method and an apparatus for cleaning a wafer container and more particularly, relates to a method for dry cleaning a wafer container that is equipped with a bottom mounting plate covered with contaminating particles by first mounting the container in an enclosure and then blowing an inert gas or air on the bottom mounting plate and simultaneously withdraw by vacuum the inert gas or air that contains contaminating particles.

BACKGROUND OF THE INVENTION

In the recent development of semiconductor fabrication technology, the continuous miniaturization in device fabricated demands more stringent requirements in the fabrication environment and contamination control. When the feature size was in the 2 µm range, a cleanliness class of 100–1000 (which means the number of particles at sizes larger than 0.5 µm per cubic foot) was sufficient. However, when the feature size is reduced to 0.25 µm, a cleanliness class of 0.1 is required. It has been recognized that an inert mini-environment may be the only solution to future fabrication technologies when the device size is reduced further. In order to eliminate micro-contamination and to reduce native oxide growth on silicon surfaces, the wafer processing and the loading/unloading procedures of a process tool must be enclosed in an extremely high cleanliness mini-environment that is constantly flushed with ultrapure nitrogen that contains no oxygen and moisture.

Different approaches in modern clean room design have been pursued in recent years with the advent of the ULSI technology. One is the utilization of a tunnel concept in which a corridor separates the process area from the service area in order to achieve a higher level of air cleanliness. Under the concept, the majority of equipment maintenance functions are conducted in low-classified service areas, while the wafers are handled and processed in more costly high-classified process tunnels. For instance, in a process for 16M and 64M DRAM products, the requirement of contamination control in a process environment is so stringent that the control of the enclosure of the process environment for each process tool must be considered. This stringent requirement creates a new mini-environment concept. Within the enclosure of the mini-environment of a process tool, an extremely high cleanliness class of 0.1 (which means the number of particles at sizes larger than 0.1 µm per cubic foot) is maintained, in contrast to a cleanliness class of 1000 for the overall production clean room area In order to maintain the high cleanliness class inside the process tool, the loading and unloading sections of the process tool must be handled automatically by an input/output device known as a SMIF (standard mechanical interface) apparatus. A cassette of wafer can be transported into the process tool by a SMIF pod situated on top of a SMIF apparatus.

A conventional SMIF apparatus consists of a robotic transfer system or a robotic arm which is normally configured for gripping the top of a cassette from a platform on which the cassette is placed (inside a pod). The robotic arm, sometimes is replaced by a gripper assembly, is capable of transporting the cassette into the process tool and place it on a platform vertically such that the cassette is oriented horizontally. At the beginning of the process, an operator positions a SMIF pod on top of a SMIF arm port which contains a cassette for holding a large number of wafers in an upright position. The SMIF arm port then descends into the SMIF apparatus for the robotic arm to transport the cassette into the process tool. The SMIF system is therefore capable of automatically utilizing clean isolation technology to maintain a high class clean room effectiveness near wafers and processing equipment. The operation of the robotic arm or the gripper is controlled by an ancillary computer (not shown) or by the process tool. The cassette carries wafers or other substrates that are being processed.

Referring initially to FIGS. 1A and 1B, wherein the top view of a SMIF arm port 10 is shown in FIG. 1A while a bottom view of a SMIF pod 20 is shown in FIG. 1B. In the bottom view of the SMIF pod 20, a bottom mounting plate 22 is used for matching to the SMIF arm port 10 on its top surface 12. At the beginning of a wafer loading process, an operator positions SMIF pod 22 on top of the SMIF arm port 10. The mating process for the two surfaces 12, 22 is carried out by human hands and therefore, friction between the two surfaces 12, 22 cannot be avoided. To accomplish the mating process, the locating pins 14 on the SMIF arm port surface pod 12 must penetrate the apertures 24 on the bottom mounting plate 18. A mechanical locking device 16 located on the top plate surface 12 of the SMIF arm port 10 must further be aligned with the pod lock alignment hole 26 on the bottom mounting plate 18 of SMIF pod 20. During the mating operation of the two surfaces 12 and 22, frictional forces between the surfaces generates particles in between the surfaces. The most likely areas that cumulate particles are areas close to the locating pins 14 and close to the pod lock 16. For instances, the shaded areas 28 shown in FIG. 1A illustrate typical locations where particles contaminations occur.

While SMIF pods are normally cleaned in a wet cleaning process by utilizing deionized water or other cleaning solvents periodically during a preventive maintenance procedure. The wet cleaning is only used to clean the wafer cassette positioned inside the SMIF pod and the interior surfaces in the pod. Due to the presence of mechanical components in the SMIF arm port 10 and on the SMIF pod bottom mounting plate 20, i.e., the pod lock 16 which is fabricated of metal, the SMIF arm port 10 and the bottom mounting plate 20 of the SMIF pod can not be cleaned in a wet cleaning process in order to prevent corrosion and other deteriorating effects caused by the cleaning solvent.

Presently, the surfaces on the SMIF arm port 10 and on the bottom mounting plate 20 of the SMIF pod can only be cleaned by manually wiping the surfaces with a dustless cleaning cloth, or with a dustless cleaning cloth wetted with isopropyl alcohol. However, the surface wiping method does not thoroughly clean the particles on the SMIF arm port or on the bottom mounting plate.

While other cleaning methods for the SMIF arm port and for the bottom mounting plate have been proposed, none of them is effective in correcting the particle contamination problem. For instance, others have proposed the use of adhesive tape to remove particles from the surfaces. However, residual adhesive from an adhesive tape left on the surfaces may cause more severe contamination problem. A rolling brush has also been used to remove particles from the bottom mounting plate of a SMIF pod, however, the brush generates electrostatic electricity which leads to further accumulation of particles.

It is therefore an object of the present invention to provide a method for cleaning a wafer container that does not have the drawbacks or shortcomings of the conventional methods.

It is another object of the present invention to provide a method for cleaning the bottom mounting plate of a wafer container that does not require a wet cleaning process.

It is a further object of the present invention to provide a method for cleaning the bottom mounting plate of a wafer container that can be carried out either with or without wafers in the container.

It is still another object of the present invention to provide a method for cleaning the bottom mounting plate of a SMIF pod that can be easily carried out without causing a fabrication yield loss.

It is another further object of the present invention to provide a method for cleaning the bottom mounting plate of a SMIF pod that can be easily carried out by mounting the pod in an enclosure.

It is yet another object of the present invention to provide a method for cleaning the bottom mounting plate of a SMIF pod that only requires a high pressure air or inert gas and a factory vacuum source.

It is still another further object of the present invention to provide a n apparatus for cleaning the bottom mounting plate of a wafer container that includes an enclosure for mounting the wafer container thereto, a conduit for supplying a high pressure air or inert gas, and a conduit for supplying a factory vacuum.

SUMMARY OF THE INVENTION

In accordance with the present invention, a method for cleaning a wafer container equipped with a bottom mounting plate and an apparatus for cleaning the wafer container are disclosed.

In a preferred embodiment, a method for cleaning a wafer container equipped with a bottom mounting plate can be carried out by the operating steps of providing an enclosure that has a top panel equipped with at least one opening for positioning a wafer container therein, four side panels and a bottom panel forming a substantially air-tight cavity; mounting a wafer container equipped with a bottom mounting plate covered with contaminating particles in the opening in the top panel of the enclosure such that the bottom mounting plate is substantially exposed to the cavity; directing a first flow of air or inert gas toward the bottom mounting plate to dislodge the contaminating particles; and withdrawing a second flow of air or inert gas containing the contaminating particles into a factory vacuuming system.

The method for cleaning a wafer container that is equipped with a bottom mounting plate may further include the step of providing the top panel with two openings for positioning two wafer containers therein. The method may further include the step of providing at least one air or inert gas feed conduit and at least one factory vacuum line conduit through the bottom panel of the enclosure. The method may further include the steps of providing an exhaust opening in the bottom panel and connecting the exhaust opening to factory exhaust. The method may further include the step of directing the first flow of air or inert gas toward the bottom mounting plate in a preset scanning mode, or the step of directing the first flow of air or inert gas toward the bottom mounting plate at a pressure of at least 5 psi.

The method for cleaning a wafer container that is equipped with a bottom mounting plate may further include the step of withdrawing the second flow of air or inert gas containing the contaminating particles into the factory vacuum system maintained at a pressure not higher than 740 mmHg. The method may further include a step of directing a first flow of an inert gas selected from a gas consisting of nitrogen, helium and argon towards the bottom mounting plate to dislodge the contaminating particles. The method may further include the step of directing a first flow of an inert gas of nitrogen toward the bottom mounting plate to dislodge the contaminating particles, or the step of directing a first flow of air or inert gas and the step of withdrawing a second flow of air or inert gas are executed simultaneously.

The present invention is fir further directed to an apparatus for cleaning a wafer container that is equipped with a bottom mounting plate which includes an enclosure formed by a top panel that has at least one opening adapted for positioning a wafer container therein, four side panels and a bottom panel forming a substantially air-tight cavity; at least one wafer container equipped with a bottom mounting plate covered with contaminating particles positioned in at least one opening of the enclosure with the bottom mounting plate substantially exposed to the cavity; a first conduit installed through the bottom panel for feeding a purge gas into the cavity towards the bottom mounting plate and for dislodging the contaminating particles from the bottom mounting plate; and a second conduit installed through the bottom panel for withdrawing the purge gas containing the contaminating particles from the substantially air-tight cavity.

In the apparatus for cleaning a wafer container that is equipped with a bottom mounting plate, the contaminating particles may be generated by friction between the bottom mounting plate of the wafer container and the wafer container port. The apparatus may have two openings in the top panel of the enclosure for accommodating two wafer containers, two first conduits and two second conduits. The second conduit may be a vacuum conduit in fluid communication with a factory vacuum source. The purge gas may be a gas selected from the group consisting of air, nitrogen, helium and argon. The purge gas may have a pressure of at least 5 psi. The second conduit may be connected in fluid communication with a factory vacuum source that has a pressure of not higher than 740 mmHg. The second conduit may be installed juxtaposed to the first conduit.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1A:
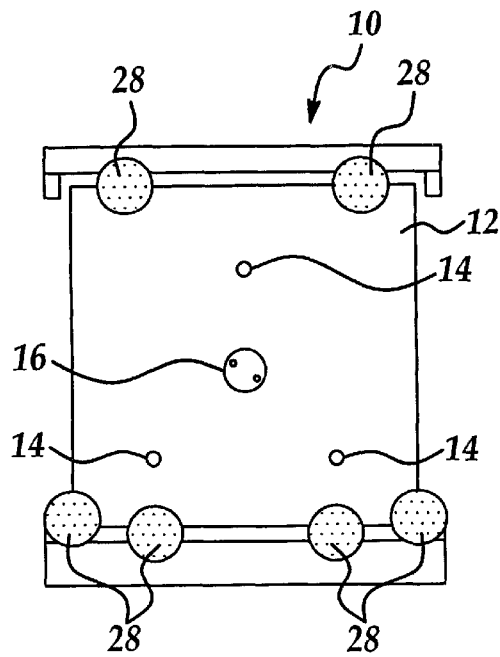
FIG. 1A is a top view of a conventional SMIF arm port.

The present invention discloses a method for cleaning a wafer container that is equipped with a bottom mounting plate. The method can be carried out by first providing an enclosure that has a top panel equipped with at least one opening or accommodating at least one wafer container thereon, four side panels and a bottom panel to form a substantially air-tight cavity. After a wafer container that is equipped with a bottom mounting plate covered with contaminating particles is mounted in the at least one opening and the bottom mounting plate is substantially exposed to a cavity in the enclosure, a first flow of air or inert gas is directed at the bottom mounting plate to dislodge the contaminating particles, and simultaneously a second flow of air or inert gas that contains the contaminating particles is withdrawn from the cavity into a factory vacuum system.

The invention further discloses an apparatus for use in dry cleaning a wafer container, such as a SMIF pod that has a bottom mounting plate covered with contaminating particles. The apparatus includes an enclosure formed by a top panel, four side panels and a bottom panel to contain a substantially air-tight cavity. The top panel has at least one opening adapted for positioning at least one wafer container thereon with at least one bottom mounting plate exposed to the cavity. The apparatus further includes a first conduit installed through the bottom panel for feeding purge gas into the cavity toward the bottom mounting plate for dislodging the contaminating particles from the bottom mounting plate, and a second conduit installed through the bottom panel for withdrawing the purge gas containing the contaminating particles from the substantially air-tight cavity.

The present invention novel method and apparatus can be designed to clean one or numerous wafer containers or SMIF pods as necessary. When more wafer containers are to be cleaned simultaneously, a larger enclosure is required to accommodate the containers. While the present invention novel method and apparatus can be used to clean the bottom of any suitable containers, they are particularly suitable for cleaning a wafer containing device such as a SMIF pod, i.e., for dry cleaning the particles generated after a SMIF pod is repeatedly positioned or removed from a SMIF arm.

The present dry cleaning method and apparatus for cleaning a SMIF pod can be carried out in a dry cleaning mode by using high pressure air, i.e. a high pressure clean dry air or an inert gas, a vacuum source to withdraw the purge gas and an exhaust from the enclosure to the factory exhaust system. The present invention novel method and apparatus can be utilized to clean a SMIF pod regardless whether a cassette or wafers are present inside the pod or not. It is therefore not necessary to remove the cassette or wafers before a dry cleaning process by the present invention. It has been proven that the present invention novel dry cleaning process does not affect the wafers contained in the SMIF pod, i.e. does not increase particle contamination on the wafers that are stored inside the pod. The cleaning route, or the process flow for the SMIF pod dry cleaning can be configured to enhance the efficiency such that the additional dry cleaning process of the present invention does not result in any loss in wafer yield.

By utilizing the present invention novel method and apparatus, a cross contamination caused by the SMIF pod and carried from one process stage to the next can be completely eliminated. The present invention novel method and apparatus of a SMIF pod dry cleaner utilizes high pressure inert gas or air to purge out adhered contaminating particles on the SMIF pod bottom plate and to evacuate the particles through a factory vacuum line. When a suitable enclosure is used, the enclosure for the SMIF pod dry cleaner provides noise-proof environment during the cleaning process, while ventilation by a factory exhaust can be utilized to ensure that particles do not accumulate inside the enclosure.

The high pressure inert gas purge line and the vacuum line for evacuating the purge gas in the present invention apparatus can be configured either in a fixed position or in a programmable pattern to clean the SMIF pod with higher efficiency. For instance, the purge gas line and the vacuum line may be mounted on a programmable moveable arm, or on a carousel to follow the contour of the SMIF pod bottom mounting plate to be cleaned. The duration for cleaning in the SMIF pod dry cleaner can be pre-programmed or controlled by a timer in order to minimize any loss in productivity. The present invention SMIF pod dry cleaner can be monitored to ensure its cleaning efficiency. The operation of the dry cleaning process does not cause any contamination problems to the wafers stored inside the SMIF pod or otherwise to the clean room environment.

Figure 1B:
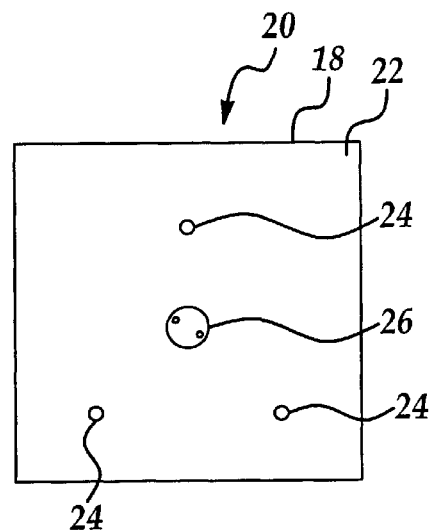
FIG. 1B is a bottom view of a conventional SMIF pod.
Figure 2A:
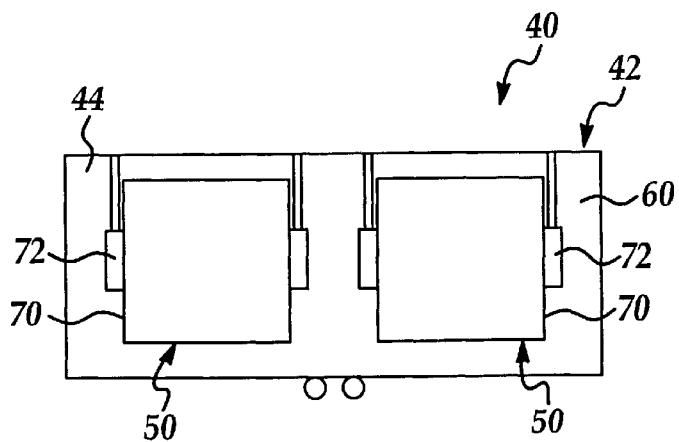
FIG. 2A is a top view of the present dry cleaning apparatus for accommodating two wafer containers.
Figure 2B:
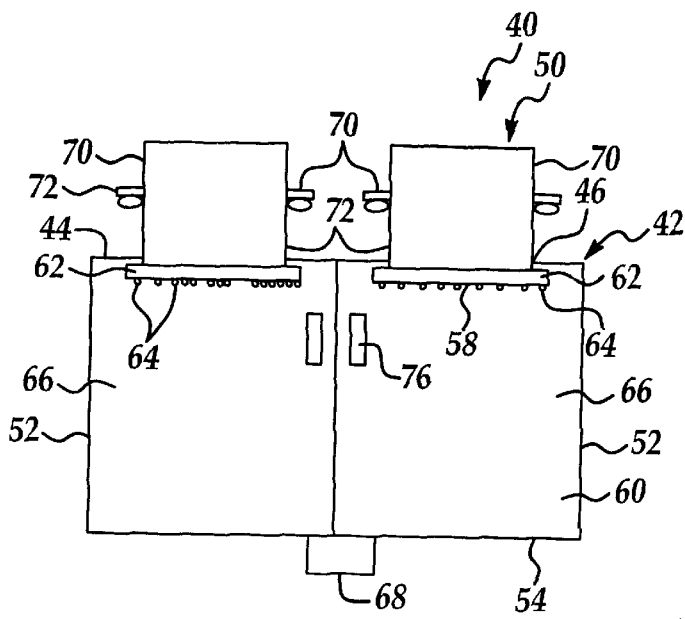
FIG. 2B is a front view of the present invention dry cleaning apparatus for accommodating two wafer containers.
Figure 2C:
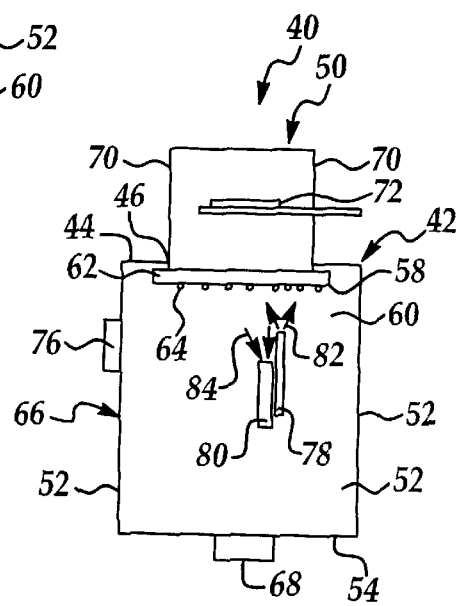
FIG. 2C is a side view of the present invention dry cleaning apparatus shown in FIG. 2B.

Referring now to FIGS. 2A, 2B and 2C, wherein a present invention dry cleaning apparatus 40 is shown in a top view, a front view and a side view, respectively. The dry cleaning apparatus 40 is constructed by an enclosure 42 formed by a top panel 44 that has at least one opening 46, even though two are shown in FIGS. 2A–2C, adapted for positioning a wafer container 50 therein. The enclosure 42 is further formed by four side panels 52 and a bottom panel 54 to form a substantially air-tight cavity 60 therein. At least one wafer container 50 that is equipped with a bottom mounting plate 62 covered with contaminating particles 64 can be positioned in the opening 46 forming a seal between the top panel 44 and the SMIF pod side walls 70 with the bottom mounting plate 62 and the contaminating particles 64 exposed to cavity 60. The SMIF pod 60 is further provided with carrying handle 72 for handling by cleaning room personnel. It should be noted, as previously described, the contaminating particles 64 are most likely generated between the locating pins 14 and the apertures 24 and between the pod lock 16 and the pod lock alignment hole 26 as shown in FIGS. 1A and 1B. The friction produced between the SMIF arm port 10 and the SMIF pod bottom plate 20 also produces contaminating particles during the positioning and the removing of the SMIF pod by an operator.

The enclosure 42 far further includes an exhaust port 68 that is provided at the bottom panel for connecting to a factory exhaust system. The function of the exhaust port 68 is to insure that no particles will accumulate in the cavity 60 of the enclosure 42. It removes contaminating particles that are not picked up by the factory vacuum conduit 80, shown in FIG. 2C and FIG. 3. Also shown in FIGS. 2B and 2C are two front panel doors 66 equipped with door handles 76.

Figure 3:
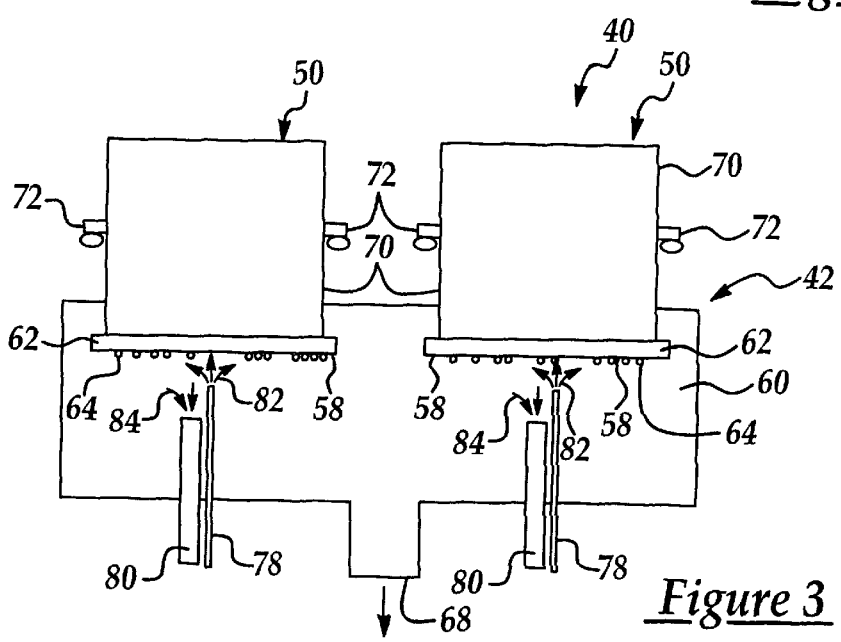
FIG. 3 is a cross-sectional view of the present invention dry cleaning apparatus adapted for cleaning two wafer containers simultaneously.

FIG. 3 is a cross-sectional view of the present invention dry cleaning apparatus 40 illustrating the positioning of the purge gas conduit 78 and the vacuum conduit 80. As shown in FIG. 3, a purge gas 82 flows through the purge gas conduit 78 directed at the bottom surface 58 of the bottom mounting plate 62. A suitable purge gas of air, i.e., clean dry air or any suitable inert gas such as nitrogen, helium or argon may be used. A suitable pressure for the air or inert gas is at least 5 psi. The purge gas conduit 78 may either be positioned stationarily, or be scanned in a pre-programmed manner in the x-y direction specific to the contour of the bottom mounting plate 62. When the scanning mode is preferred for achieving higher cleaning efficiency, the purge gas conduit 78 may be suitably mounted on a moveable arm or on a carousel. A vacuum conduit 80 is mounted juxtaposed to the purge gas conduit 78 such that it picks up purge gas 84 that contains contaminating particles 64 dislodged. The vacuum conduit 80 should be connected to a factory vacuum source that has a vacuum pressure of not higher than 740 mmHg. The contaminating particles 64 that are dislodged by the purge gas 82 are picked up immediately by the vacuum conduit 80 and removed from the wafer container 50. A small number of contaminating particles 64 dislodged from the surface 58 of the bottom mounting plate 62 that are not picked up by the vacuum conduit 80, may be exhausted through the exhaust port which is connected to a general factory exhaust. The present invention novel dry cleaning apparatus therefore ensures that no contaminating particles can cumulate inside cavity 60 of the enclosure 42.

It should be noted that while two wafer containers 50 are shown in the present invention preferred embodiment, any suitable numbers of wafer containers may be cleaned simultaneously by building a large enclosure 42 such that more containers may be accommodated.

The present invention novel method and apparatus for dry cleaning a wafer container have therefore being amply described in the above description and in the appended drawings of FIGS. 2A–3.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for cleaning a wafer container equipped with a bottom mounting plate comprising the steps of:
    providing an enclosure having a top panel equipped with at least one opening for positioning a wafer container therein, four side panels and a bottom panel forming a substantially air-tight cavity therein;
    mounting a wafer container equipped with a bottom mounting plate covered with contaminating particles in said opening in the top panel of the enclosure such that said bottom mounting plate is substantially exposed to said cavity;
    directing a first flow of air or inert gas toward said bottom mounting plate to dislodge said contaminating particles; and
    withdrawing a second flow of air or inert gas containing said contaminating particles into a factory vacuum system.

2. A method for cleaning a wafer container equipped with a bottom mounting plate according to claim 1 further comprising the step of providing said top panel with two openings for positioning two wafer containers therein.

3. A method for cleaning a wafer container equipped with a bottom mounting plate according to claim 1 further comprising the step of providing at least one air or inert gas feed conduit and at least one factory vacuum line conduit through said bottom panel of the enclosure.

4. A method for cleaning a wafer container equipped with a bottom mounting plate according to claim 1 further comprising the steps of providing an exhaust opening in said bottom panel and connecting said exhaust opening to factory exhaust.

5. A method for cleaning a wafer container equipped with a bottom mounting plate according to claim 1 further comprising the step of directing said first flow of air or inert gas toward said bottom mounting plate in a pre-set scanning mode.

6. A method for cleaning a wafer container equipped with a bottom mounting plate according to claim 1 further comprising the step of directing said first flow of air or inert gas toward said bottom mounting plate at a pressure of at least 5 psi.

7. A method for cleaning a wafer container equipped with a bottom mounting plate according to claim 1 further comprising the step of withdrawing said second flow of air or inert gas containing said contaminating particles into said factory vacuum system maintained at a pressure not higher than 740 mmHg.

8. A method for cleaning a wafer container equipped with a bottom mounting plate according to claim 1 further comprising the step of directing a first flow of an inert gas selected from the group consisting of nitrogen, helium and argon toward said bottom mounting plate to dislodge said contaminating particles.

9. A method for cleaning a wafer container equipped with a bottom mounting plate according to claim 1 further comprising the step of directing a first flow of an inert gas of nitrogen toward said bottom mounting plate to dislodge said contaminating particles.

10. A method for cleaning a wafer container equipped with a bottom mounting plate according to claim 1, wherein said step of directing a first flow of air or inert gas and said step of withdrawing a second flow of air or inert gas are executed simultaneously.

* * * * *